(12) United States Patent
Senderowicz (10) Patent No.: US 8,058,950 B1
(45) Date of Patent: Nov. 15, 2011

(54) HIGHLY SELECTIVE PASSIVE FILTERS USING LOW-Q PLANAR CAPACITORS AND INDUCTORS

(76) Inventor: Daniel Senderowicz, Moraga, CA (US)

(*) Notice: Subject to any disclaimer, the term of this patent is extended or adjusted under 35 U.S.C. 154(b) by 0 days.

(21) Appl. No.: 12/082,922

(22) Filed: Apr. 14, 2008

Related U.S. Application Data (63) Continuation-in-part of application No. 10/898,666, filed on Jul. 22, 2004, now abandoned.

(60) Provisional application No. 60/489,582, filed on Jul. 22, 2003.

(51) Int. Cl.
*H03H 7/01* (2006.01)
(52) U.S. Cl. .................. 333/175; 333/167; 333/177
(58) Field of Classification Search .......... 333/167, 333/176, 177, 178, 180, 185, 175; 336/200, 336/217
See application file for complete search history.

(56) References Cited

U.S. PATENT DOCUMENTS

| | | | | |
|---|---|---|---|---|
| 5,656,849 | A * | 8/1997 | Burghartz et al. | 257/528 |
| 6,370,033 | B1 * | 4/2002 | Saegusa et al. | 361/777 |
| 6,549,097 | B2 * | 4/2003 | Guillon et al. | 333/174 |
| 6,856,499 | B2 * | 2/2005 | Stokes | 361/277 |
| 6,970,057 | B2 * | 11/2005 | Lin et al. | 333/177 |
| 7,002,434 | B2 * | 2/2006 | Lin et al. | 333/167 |

OTHER PUBLICATIONS

Nguyen et al , "Si IC Compatible Inductors and LC Passive Filter", Aug. 1990, IEEE Journal of Solid State Circuits, vol. 25, No. 4, pp. 1028-1031.*

* cited by examiner

*Primary Examiner* — Robert Pascal
*Assistant Examiner* — Kimberly Glenn
(74) *Attorney, Agent, or Firm* — Donald L. Beeson; Beeson Skinner Beverly LLP (57) ABSTRACT

A highly selective frequency filter is created from lossy components such as found in standard integrated circuit technologies, including particularly CMOS technologies, without the use of active loss cancellation circuitry. The filter configuration is based on using inductively coupled planar inductors for introducing a mutual inductance factor that advantageously alters the frequency response of the filter.

15 Claims, 10 Drawing Sheets

FIG. 1

PRIOR ART

FIG. 1A

PRIOR ART

FIG. 2

PRIOR ART

PRIOR ART

FIG. 6B

PRIOR ART

HIGHLY SELECTIVE PASSIVE FILTERS USING LOW-Q PLANAR CAPACITORS AND INDUCTORS

CROSS-REFERENCE TO RELATED APPLICATIONS

This is a continuation-in-part of application Ser. No. 10/898,666, filed Jul. 22, 2004, which claims the benefit of U.S. Provisional Application No. 60/489,582, filed Jul. 22, 2003.

BACKGROUND OF THE INVENTION

This invention relates to the construction of selective frequency filters, specifically to configurations and methodologies suitable for their implementation using monolithic capacitors and monolithic planar inductors with low Q (factor of merit) such as those available in standard integrated circuits technologies.

The mathematical behavior of frequency filters is described with a transfer function that depends on the complex frequency (s) and a number of complex constants. This transfer function has the form:

$$H(s) = \left( \frac{(s-z_0)(s-z_1) \ldots (s-z_N)}{(s-p_0)(s-p_1) \ldots (s-p_M)} \right) \quad (1)$$

where $N \leq M$ for any passive network. The complex constants $z_i$ are called the zeros and the $p_j$ are the poles. As can be seen from (1), both the values of the poles and zeros determine the shape of the transfer function. If the network is passive and loss-less, the zeros are imaginary numbers (the real part equals zero). The poles are complex numbers where the real part is negative. The ratio between the imaginary and real parts of the poles is called the Q (to be distinguished from the Q of the electrical components implementing the filter).

One of the most common passive filter architectures is the doubly terminated loss-less LC ladder. This topology is based on a network of reactive components, such as inductors and capacitors, inserted between termination resistors. A multiplicity of signal generators are connected at the source side, and the resulting filtered signal is obtained at the load side.

The functionality of these filters is based on the fact that across the passband region there is maximum power transfer through the reactive network, and in the stopband, most of the signal energy is reflected back to the source end.

For loss-less LC ladders, there is an elegant and powerful synthesis tool for the design. This mathematical procedure yields the values of the components as a function of the poles and zeros of the transfer function. Synthesis procedures have been extensively documented, such as for example in the book by A. S. Sedra and P. O. Brackett: *Filter Theory And Design: Active and Passive*. Also, there are several computer programs available implementing synthesis, FILTOR2 being one of them. On the other hand, when the components are lossy, as shown below, the accepted solution is to introduce active circuitry in order to compensate for the losses. In this fashion, the combined arrangement of the lossy component and the active cancellation circuitry yields the equivalent of loss-less components, as described in the article by D. L. Li and Y. Tsividis: "Design Techniques for Automatically Tuned Integrated Gigahertz-Range Active Filters", *IEEE J. Solid-State Circuits*, vol. SC-37, pp. 967-977, August 2002.

For a real inductor, the Q at a given angular frequency $\omega$ is given by:

$$Q_0 = \left( \frac{\omega_0 L}{r} \right) \quad (2)$$

where L is the inductance and r is the series resistance. For the case of a capacitor, the Q is:

$$Q_0 = \left( \frac{\omega_0 C}{g} \right) \quad (3)$$

where C is the capacitance and g is the parallel conductance. In a loss-less component, the $Q_0$ in (2) and (3) is infinity.

The most common type of capacitors used in silicon integrated circuits is the planar type. These can have fixed or variable values of capacitance. The fixed type is built by stacking two or more layers or plates of a conductive material such as metal, separated by one or more layers of insulating material known as dielectric. The most common variable type, also referred to as varactor, changes its value as a function of a bias voltage applied across the plates. This type can be built with a semiconductor junction, or using the nonlinear properties of metal-oxide-silicon (MOS) interfaces. Variable capacitors are used to vary or adjust the spectral characteristics of filters by means of one or more bias voltages applied across one or more capacitors in the network. The Q's of integrated planar capacitors can reach values in the 100's.

A planar inductor in silicon integrated technology is built as a spiral of a conductive material, such as aluminum or copper, set on top of insulating material, generally silicon dioxide ($Si_2O$). The shape of the spiral can be made circular or polygonal. Two or more inductors can be placed in physical proximity forming a set of coupled-inductors (a transformer). The Q of these planar inductors rarely achieves values greater than 20. This Q is too low to be considered a low-loss component suitable for the implementation with conventional synthesis methods. Thus inductors are the main roadblock for the construction of highly selective filters using conventional synthesis methods.

M. Dishal in his paper: "Design of dissipative band-pass filters producing desired Transformers for Si RF IC's", *Proc. Inst. Radio Eng.*, vol. 37, pp. 1050-1069; September 1949 shows a methodology for the design of frequency filters using lossy components without any active cancellation. It is based on mathematically compensating for the finite Q of the resonators in the calculation of the filter component values. However, his filter configurations are still based on-loss-less ladders that include the termination resistors. There is a quantitative ingredient in his line of work that pertains to the fact that the Q of his resonators are much larger than any Q in the desired transfer function. In short, Dishal's work demonstrates a way to compensate for moderate to low losses of the components in a conventional filter architecture.

Figure 1:
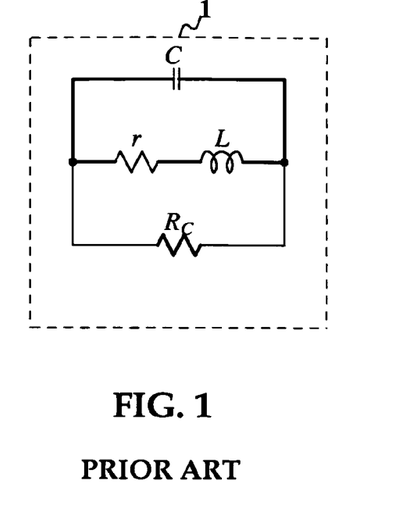
FIGS. 1 and 1A show an example of a cancellation circuit for a lossy resonator found in the prior art.
Figure 1A:
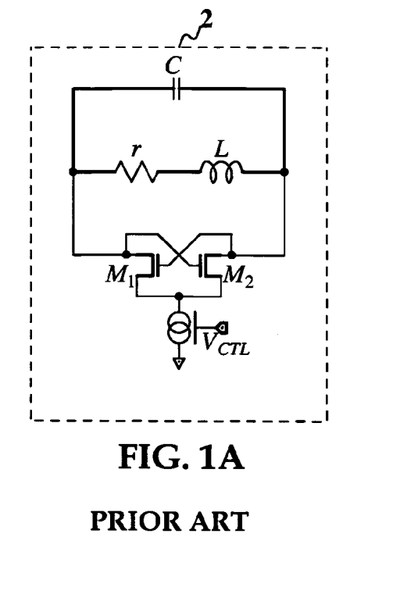

Given the convenience of existing computer synthesis tools, designers are currently using circuitry such as those described by Li et al, aimed at canceling the losses to achieve nearly loss-less inductors by nulling the denominator of (2), as illustrated in FIGS. 1 and 1A. FIG. 1 shows a resonator 1 with a lossy inductor of value L, where the loss is represented by the series resistor r as indicated in (2). The obvious cancellation configuration would be to place a negative resistor in series to null the total resistance. However, because of some limitations in active circuits, it is considerably simpler and more feasible to use a parallel negative resistor $R_c$ to achieve cancellation. This equivalent negative resistance can be implemented with the active circuit 2 shown in FIG. 1A. The circuit formed by $M_1$ and $M_2$ is a simplified example of a cross-coupled pair in which the magnitude of negative resistance can be set by controlling the tail current of the cross-coupled pair through the control voltage $V_{CTL}$. At a given angular frequency $\omega$, the value of this parallel cancellation resistor has to be equal to:

$$R_C = -r\left(1 + \frac{\omega^2 L^2}{r^2}\right) \quad (4)$$

The main problems associated with active, loss-cancellation circuitry are the following:
(1) the cancellation circuit can use a significant amount of silicon area (die area) and consume considerable power;
(2) the unavoidable non-linearity of the cancellation circuitry creates a response that is a function of the signal amplitude, thus making many of the most critical specifications of related applications very hard to meet;
(3) the transistors in the cancellation circuitry introduce noise on the signal path;
(4) an additional complex control architecture is needed for adjusting the amount of cancellation, and inaccuracies of this cancellation could yield unstable operating conditions;
(5) this control circuitry further consumes large amounts of power and die area; and
(6) as shown in (4), because of the dependency on $\omega$, the cancellation achieved does not extend evenly through the whole passband region, thus creating inaccuracies in the resulting response.

SUMMARY OF THE INVENTION

One object of the present invention is to realize passive selective LC filters utilizing typically lossy spiral planar inductors usually found in integrated circuit technology, without using active loss cancellation circuitry. By eliminating active cancellation circuitry, other features of the present invention are also achieved: superior linearity performance, lower power consumption and smaller die area.

In order to achieve the above objects, the commonly found termination resistors of LC ladders are removed. The energy dissipation aspect of the filter, no longer determined by these termination resistors, comes as a consequence of the loss resistance of the inductors and capacitors being within the filter structure.

Another feature of this invention is that it provides a method for achieving prescribed inductive coupling coefficients based on the physical positioning of two planar inductors. This feature, in addition to allowing for the normal freedom in choosing the value of capacitive coupling, also allows for a wide choice in the selection of the filter architectures.

DETAILED DESCRIPTION OF THE ILLUSTRATED EMBODIMENTS

Figure 2:
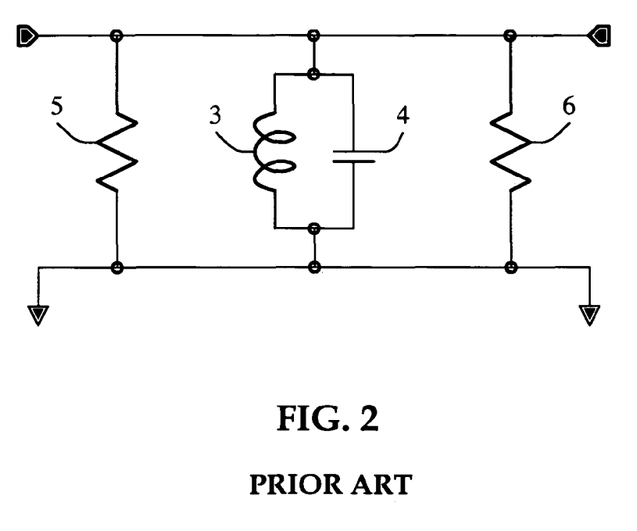
FIG. 2 is a circuit diagram of a first-order band-pass filter in which the losses in the transfer function are implemented by termination resistors.
Figure 3:
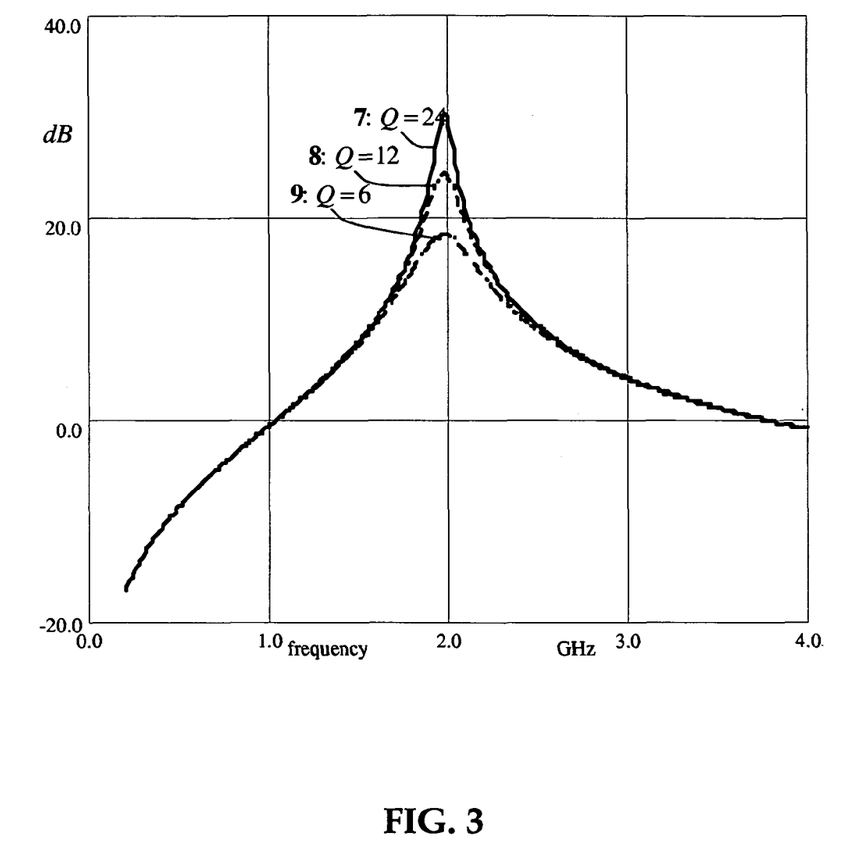
FIG. 3 shows the transfer function of the filter shown in FIG. 2 for different values of losses.

Referring to the drawings, FIG. 2 shows an example of a simple bandpass filter in the form of an LC resonator composed of inductor 3 and capacitor 4 attached to a pair of termination resistors 5 and 6. This filter has a single pair of complex poles, one zero at infinite frequency and one zero at zero frequency. For this simple case, the Q of the single pole-pair is the same as the Q of the resonator. FIG. 3 shows three different transfer functions 7, 8 and 9 for different values of Q for this filter as the value of the termination resistors are changed. It can be seen that the main difference between these curves is in the gain in the passband region, while the transition and stopband regions remain largely unaffected. This observation can be extended to higher order filters: by accepting some departure from a desirable shape of the passband region, the specified selectivity properties can be achieved with low Q components and subsequently, if needed, adequate signal post-processing can restore the desired shape in the passband region.

Highly selective filters are associated with transfer functions having high Q poles. Mathematically, it can be shown that the Q's of the transfer function of a passive filter can have larger magnitude than that of the individual Q's of the reactive components. The present invention is based on making the intrinsic losses of the integrated reactive components the main mechanism for energy dissipation within the network. However, if more energy dissipation is needed, termination resistors can be added. Thus this invention pertains to the construction of selective filters with integrated lossy elements such as spiral inductors and capacitors, either of constant or variable value. This invention will be illustrated in the implementation of a narrowband bandpass filter.

Figure 4:
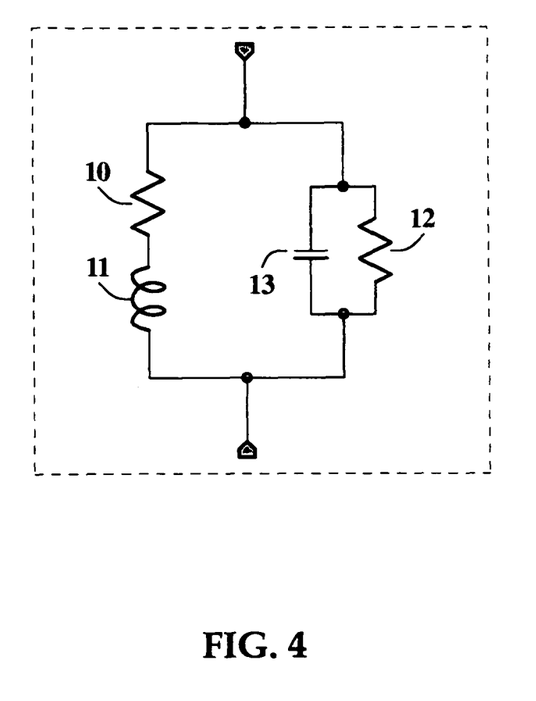
FIG. 4 is circuit diagram illustrating the natural losses occurring in an LC resonator such as those used in the present invention.

FIG. 4 shows a model for a lossy resonator. By "lossy" it is meant that the resonator components exhibit a Q of less than about 20. Resistor 10 represents the losses of inductor 11, and resistor 12 represents the losses of capacitor 13. Equations (2) and (3) above can be used to quantify the Q of these components by making L the inductance of 11, C the capacitance of 13, r the resistance of 10 and g the conductance of 12. For the sake of simplicity and without any loss of generality, the resistors representing the losses of the resonators are not shown in the drawings described.

Figure 5:
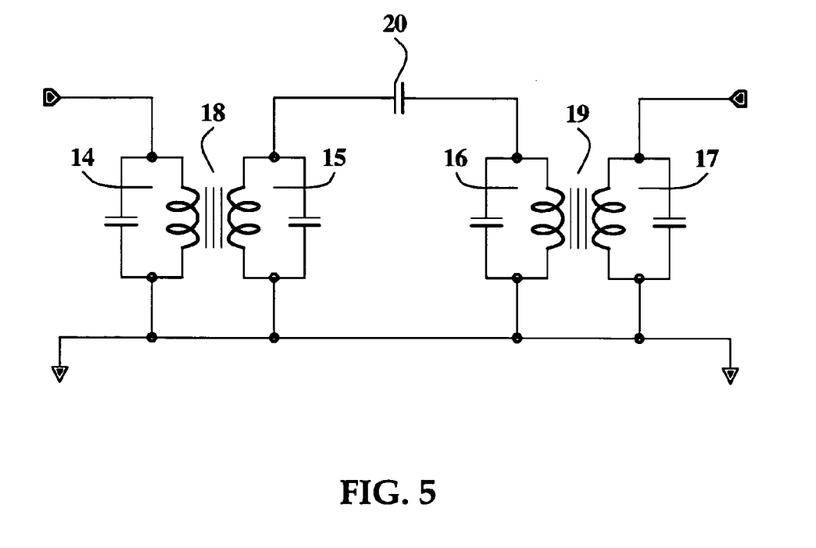
FIG. 5 is a circuit diagram illustrating an example of the present invention in the form of a circuit diagram of an eighth-order bandpass filter.

FIG. 5 shows the schematics of an eighth-order bandpass filter with a structure as described in Dishal's paper. This topology is based on a multiplicity of coupled resonators 14, 15, 16 and 17. Resonators 14 and 15 are inductively coupled by mutual inductance 18. Resonators 16 and 17 are also inductively coupled by mutual inductance 19. Resonators 15 and 16 are capacitively coupled by capacitor 20. A suitable filter design program such as FLOP can yield a desired response by giving proper values for each component, that is, for the inductances and capacitances of each resonator, as well as for the mutual capacitive and inductive coefficients.

Figure 6A:
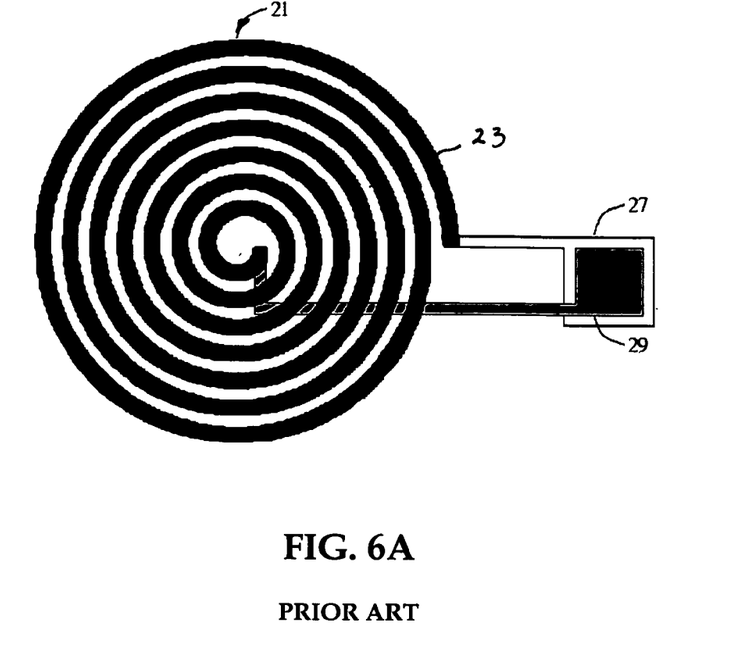
FIG. 6A is a top plan view of a single planar spiral inductor and a capacitor implemented on a CMOS chip and forming a resonator such as used in the present invention.
Figure 6B:
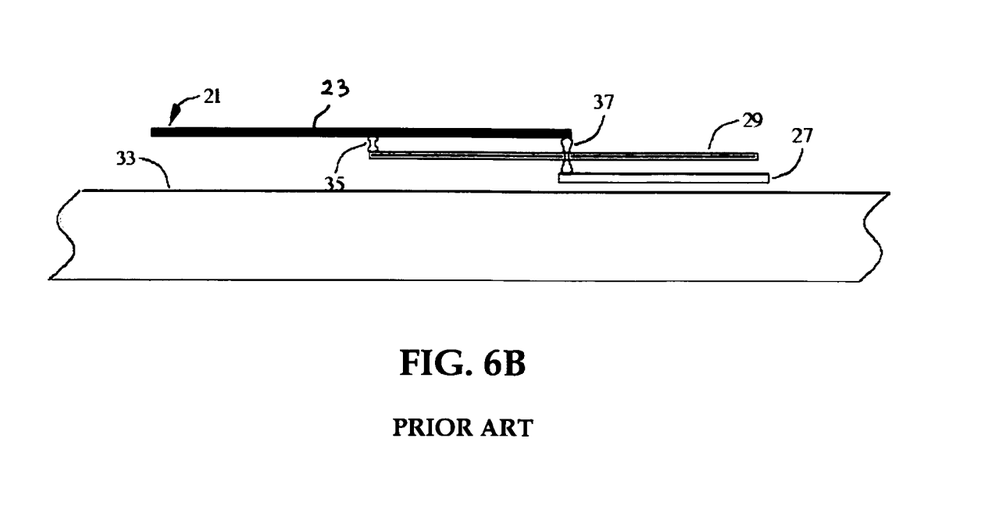
FIG. 6B is a sectional view thereof.

FIGS. 6A and 6B graphically illustrate a known resonator configuration implemented in standard CMOS technology. In standard CMOS technology, several layers of metallization are typically deposited over the active layers of the CMOS chip provided on the chip's silicon substrate. These metallization layers are separated by insulation layers, typically silicon dioxide, and serve as interconnecting components of the chip. The number of metallization layers vary, but typically five or more layers are used. The metallization layers and insulation layers have thichness on the order of one micron, with the upper metallization layers tending to be somewhat thicker than the lower metallization layers.

Referring to FIGS. 6A and 6B, the resonator 21 is seen to be formed in several of the metallization layers of the CMOS chip (the insulation layers and active layers, other than a graphical representation of the silicon substrate, are not shown). The resonator components include a planar spiral inductor 23 formed in an upper metallization layer and a planar tuning capacitor formed in two of the metallization layers below the spiral inductor. (These elements are formed in the metallization layers using fabrication techniques, such as photo lithography, well known in the art.) Specifically, the shown planar capacitor is comprised of bottom capacitor plate 25 and a top capacitor plate 29 in opposed relation over the top capacitor plate. The ends of the spiral inductor are connected to the tap connectors of the capacitor plates by conductive interconnection plugs ("vias"), such as the vias 35 and 37 shown in FIG. 6B.

It is understood that the resonator components shown in FIG. 6B represents only three metallization layers of the CMOS chip and that CMOS chip would typically include further metallization layers, including, for example, metallization layers beneath bottom capacitor plate 25 or above spiral inductor 23. However, the spiral inductor preferably resides in the chip's topmost metallization layer. This allows for a spiral conductor having a larger thickness (e.g. >1µ) and maximum spacing between the spiral inductor and the chip's silicon substrate 33.

The material chosen for the metallization layers of the CMOS chip, and hence the material of which the spiral inductor and 23 and capacitor plates 25 are formed, is typically aluminum, copper, gold or some low-resistivity alloy. Generally, in standard CMOS technology the attainable Q for such micro-thin resonator components ranges between 5 and 20. The parasitic capacitance (not shown) between the spiral and the substrate 33 (ground plane) will affect the Q of these components and should be taken into account when computing the resonant frequency of the resonator.

Figure 7A:
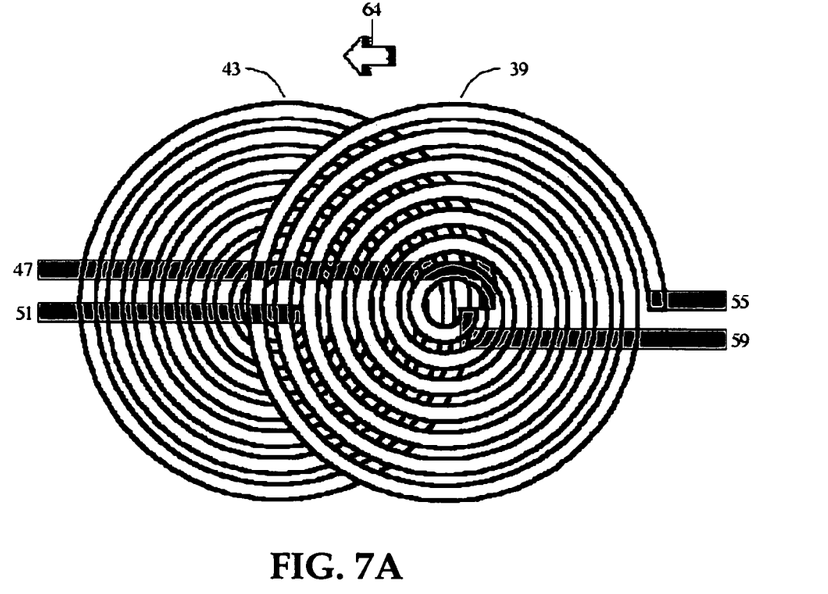
FIGS. 7A and 7B are a top plan view and a sectional view of two overlapping planar inductors implemented on a CMOS chip such as used in the present invention.
Figure 7B:
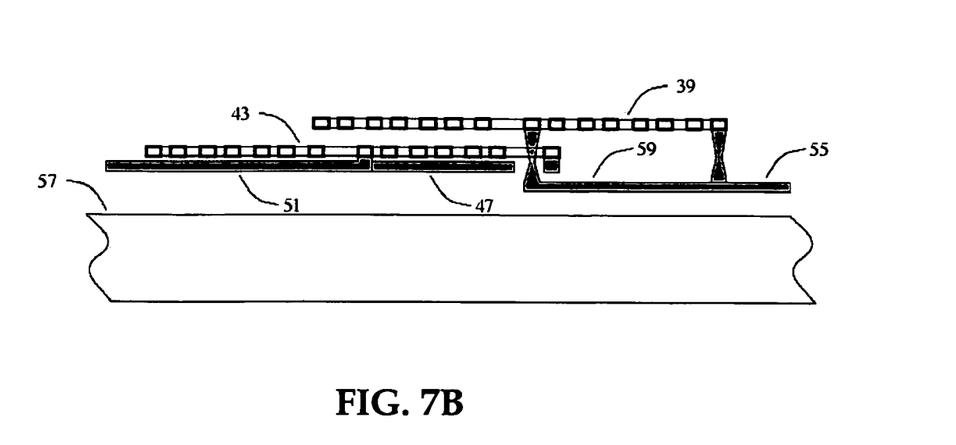

FIGS. 7A and 7B show the general implementation of more than one spiral inductor using CMOS technology and the coupling of such inductors in a manner that achieves a selective filter in accordance with the invention. Shown are two planar spiral inductors 39 and 43 formed in two different metallization layers of a CMOS chip, with spiral inductor 39 overlapping spiral inductor 43 to allow coupling between the two inductors. Tap connectors or terminals are provided at the end-points of the spirals of each of the spiral inductors 39, 43. Thus, the lower spiral inductor 43 is seen to have an outer tap connector 47 at the outer terminus of the spiral and a center tap connector at the center terminus of the spiral. Similarly, the upper spiral inductor is seen to have an outer tap connector 55 and a center tap connector 59. It is noted that the inductance of the spiral inductors depends on several variables such as:

(1) the shape of the spiral, such as circular or polygonal,
(2) the width and spacing of the loops, and
(3) the number of turns.

It is also noted that the value of the Q of the spiral inductors shown in FIGS. 7A and 7B (as well as FIGS. 6 and 6A) is affected not only by the resistivity of the micro-thin metal layer used for building the spirals, but also by capacitive coupling between the spirals and the chip's silicon substrate 57 (the ground plane). Generally, the thinner the spiral the lower the Q. Also, the shorter the distance between the spiral and the ground plane the greater the parasitic capacitance and hence lower the Q. Parasitic capacitance reduces the Q because it reduces the effective value of the spiral inductance while the series resistance of the lossy inductor remains essentially unaffected. (See equation (2) above.) However, it is discovered that by introducing mutual inductance between the spiral inductors the poles and zeros of the bandpass filter's transfer function can be manipulated in a manner that effectively decreases the width of its frequency pass band thereby increasing the filter's frequency selectivity, thus accomplishing the result normally achieved using active cancellation circuitry as discussed above. To achieve the required amount of mutual inductance requires controlling the degree of coupling between the two spiral inductors as represented by coupling coefficient K.

The relative placement of spiral inductors 39, 43 is used as the principal means of controlling this coupling. As spiral inductor 39 is slid in the direction of arrow 64, the coupling coefficient increases and reaches a maximum when the two spiral centers are aligned, that is, completely overlap. The coupling coefficient K directly affects the value of mutual inductance M between the two inductors. The mutual inductance can be expressed as a function of the coupling coefficient as follows:

$$M_{21\_22} = K_{21\_22} \times \sqrt{L_{21} \times L_{22}}$$

where:
$M_{21\_22}$ is the mutual inductance between inductors 39 and 43,
$K_{21\_22}$ is the coupling coefficient between inductors 39 and 43, and
$L_{21}, L_{22}$ are the inductances of inductors 39 and 43.

As discussed further below, the significant parameters characterizing a group of one or more interacting planar spiral inductors, such as the coupling factor K, inductance L, loss factor Q and others, can be calculated from geometrical and material characteristics by using electromagnetic analysis tools. Software packages such as ASITIC can be used for aiding in these calculations.

Figure 8:
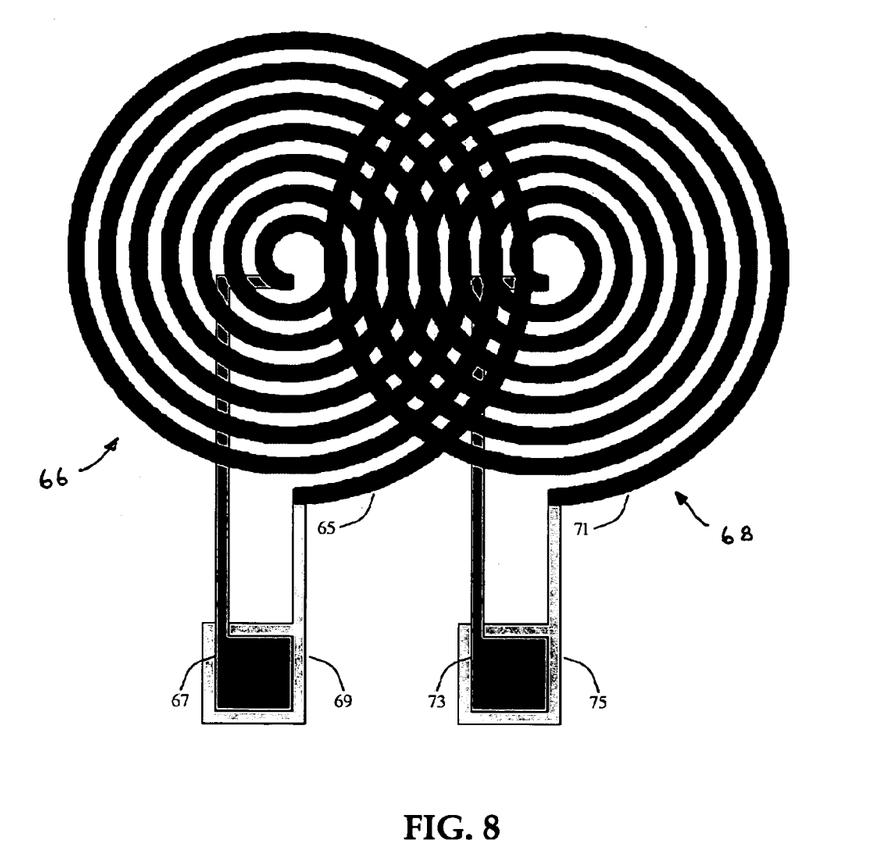
FIG. 8 shows two inductively coupled resonators such as shown in FIGS. 7A and 7B.

FIG. 8 shows an implementation of a pair of coupled resonators 66, 68 in accordance with the invention using CMOS technology. Each of the resonators includes a planar spiral inductor 65, 71 connected to top and bottom capacitor plates 67, 69 and 73, 75 in the manner of the single resonator shown in FIGS. 6A and 6B. The resonators are coupled together by means of their spiral inductors 65 and 71 which are overlapped as shown and described in FIGS. 7A and 7B. The degree to which the spiral inductors are overlapped will determine the mutual inductance between the spiral inductors and its effect on the filter's transfer function. A process for arriving at the overlap needed for a desired filter performance is described below.

Figure 9:
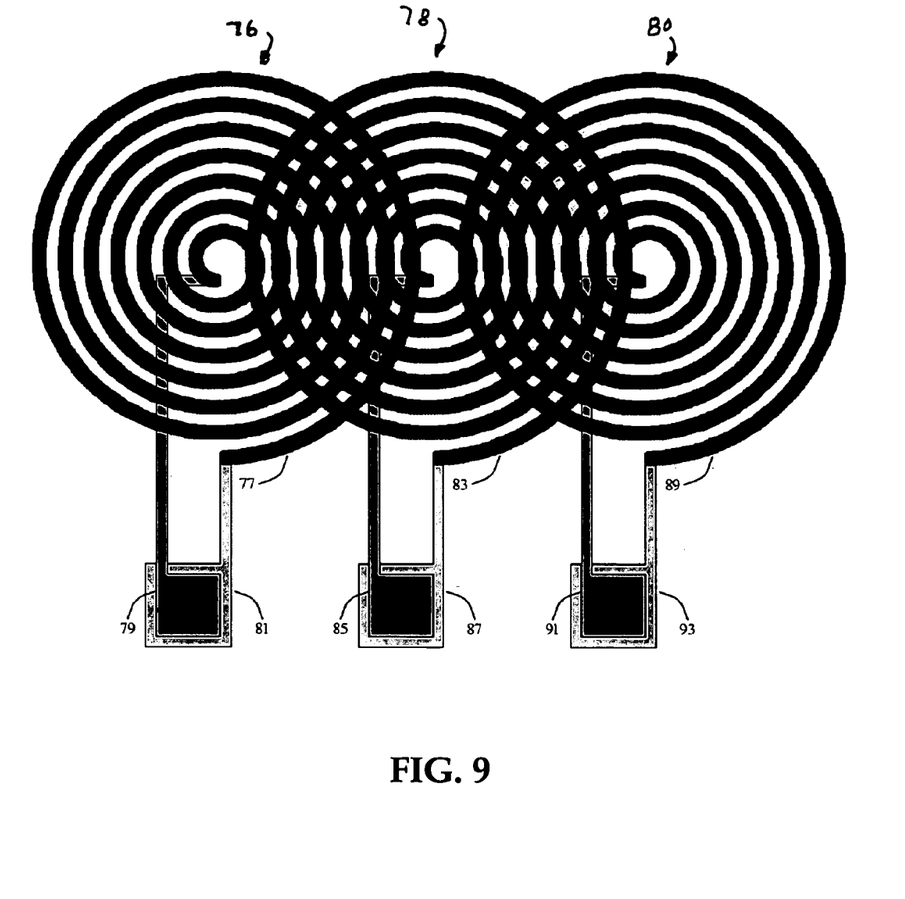
FIG. 9 shows a cascade of three inductively coupled resonators each comprised of a planar inductor and capacitor.

FIG. 9 is a representation of three cascaded LC resonators 76, 78, 80 as might be implemented using CMOS technology in a manner previously described to produce a higher order bandpass filter in accordance with the invention. In this embodiment the resonator 76 is comprised of spiral inductor 77 connected to top and bottom capacitor plates 79, 81; resonator 78 is comprised of spiral inductor 83 connected to top and bottom capacitor plates 85, 87; and resonator 80 is comprised of spiral inductor 89 connected to top and bottom capacitor plates 91, 93. Spiral inductor 77 of resonator 76 overlaps and is coupled to spiral inductor 83 of resonator 78. Spiral inductor 83 of resonator 78, in turn, overlaps and is coupled to spiral inductor 89 of resonator 80. Additional similarly contructed resonators could be added to this casade of coupled resonators.

Figure 10:
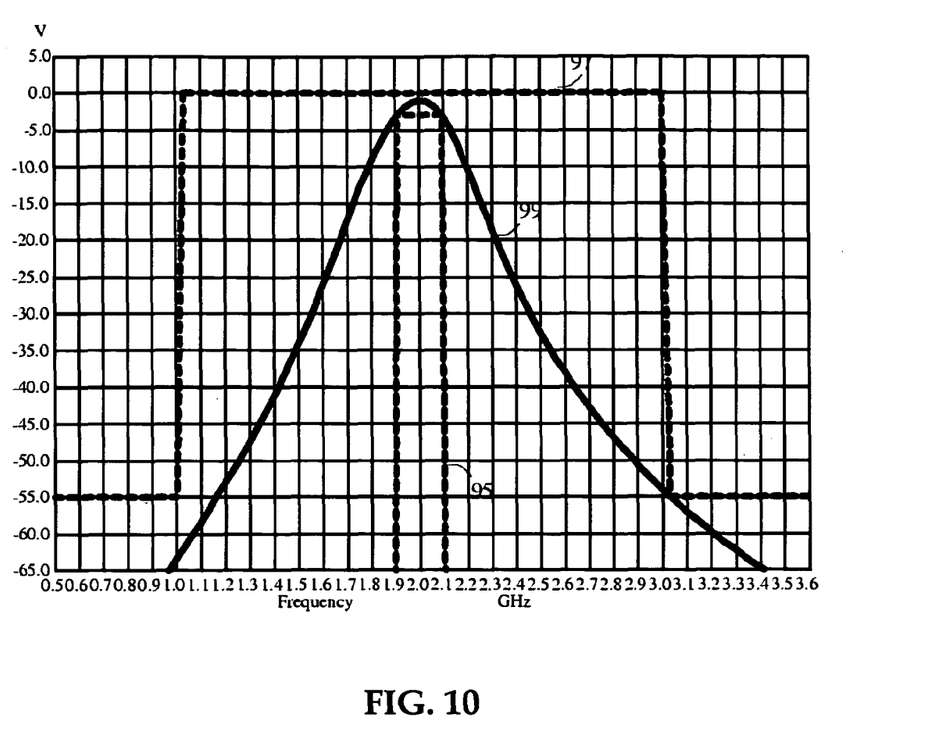
FIG. 10 a graph of a transfer function of a filter to be implemented in accordance with the invention with upper and lower templates used in arriving at the filter design parameters.

The steps for achieving the desired response of a passive, frequency selective filter from overlapped lossy inductors in accordance with the invention can be described in reference to FIG. 10. First, a pair of templates, a lower template 95 and an upper template 97, are established to set the limits for the desired final frequency response. Every point of the frequency response should remain within the boundaries of the lower and upper templates. Second, the order of the filter is initially guessed. So, for example, if the order is eight, then four resonators are required. A precise model for each resonator then has to be formalized. It should include besides the inductances and capacitances, all the resistances representing the loss mechanisms. This will result in a complex network of capacitors, inductors and resistors. An adequate program such as FLOP can be subsequently used to find the values of each component in such a way that the response fits within the established upper and lower templates. If the response does not fit within the template mask, an increase in the order of the filter may be necessary. Also, if the response fits too loosely, meaning that all the response points are far from the templates, then a reduction in the order of the filter may be possible. Finally, a program such as ASITIC can be used to solve the physical dimensions of the components based on the values found by FLOP. In particular, for the filter example above, it is found that the inductive coupling coefficient ranges around a value of K≈0.1, that is easily achieved. Naturally, other prescribed conditions would yield different values of K.

Based upon the foregoing discussion, it is seen that that a frequency filter implemented with lossy planar inductors in accordance with the present invention, avoids the need for, and therefore the problems associated with, using active circuitry to cancel out the losses of the above mentioned passive components.

Various other modifications and alterations in the structure will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What I claim is:

1. An electrical frequency filter having a characteristic selective transfer function, said electrical frequency filter comprising
   at least one planar capacitor,
   at least two inductively coupled planar inductors, each of which has a loss quality factor, Q, of less than approximately 20, and neither of which is shorted,
   wherein said inductively coupled planar inductors overlap and provide a mutual inductance expressed in terms of a coupling coefficient, K, and
   wherein the at least two planar inductors are arranged to achieve a coupling coefficient, K, that for said planar inductors, along with selected capacitance and inductance values for the at least one capacitor and the at least two inductors of the electrical frequency filter, achieves a selective transfer function in a passive circuit topology without loss cancellation circuitry.

2. The electrical frequency filter of claim 1 wherein said at least two planar inductors are overlapping spiral inductors and wherein the coupling coefficient, K, of said spiral inductors is established by setting the physical overlap of said inductors.

3. The electrical frequency filter of claim 1 wherein multiple planar capacitors and multiple planar inductors are provided and arranged in a bandpass filter circuit topology comprised of at least two coupled resonators, including inductively coupled resonators each of said resonators including at least two inductively coupled planar inductors having a loss quality factor, Q, of less than approximately 20 and at least one planar capacitor associated with each planar inductor, and said resonators being inductively coupled one to the other by means of their planar inductors.

4. The electrical frequency filter of claim 3 wherein said inductively coupled resonators are coupled by overlapping lossy planar inductors of the resonators, and wherein the coupling coefficient, K, of said the overlapping planar inductors is established by setting the physical degree of overlap of said inductors.

5. The electrical frequency filter of claim 4 wherein said the overlapping lossy planar inductors have a spiral shape of said resonators are spiral inductors, and wherein the overlap between said inductors is set by overlapping a portion of one spiral inductor on top of a portion of another spiral inductor.

6. The electrical frequency filter of claim 1 wherein the east one planer capacitor includes a planar capacitor for each of the at least two planar inductors.

7. An electrical frequency bandpass filter having a characteristic selective transfer function, said electrical frequency filter comprising
   at least two inductively coupled resonators having reactive components including lossy planar inductors characterized by a loss quality factor, Q, wherein neither of said lossy planar inductors is shorted,
   said inductively coupled resonators being inductively coupled by overlapping the lossy planar inductors having a coupling coefficient, K, established by setting the physical overlap of said inductors of the coupled resonators,
   wherein the physical overlap between the coupling lossy planar inductors of said resonators is set to achieve a coupling coefficient, K, that, along with selected values for the other reactive components of the electrical frequency bandpass filter, achieves a selective transfer function in a passive circuit topology without loss cancellation circuitry.

8. The electrical frequency band pass filter of claim 7 wherein the loss quality factor, Q, of each of said coupling planar inductors is less than approximately 20.

9. A method of creating a selective electrical frequency filter without loss cancellation circuitry, wherein the selective electrical frequency filter has a characteristic frequency response and is comprised of lossy planar inductors and planar capacitors, said method comprising
   a. establishing an upper and lower frequency response template for the a desired frequency response for the selective electrical frequency filter,
   b. using said templates to calculate a set of coefficients that formulate the geometric characteristics of the capacitors, inductors, and the coupling between the capacitors and inductors, for a filter circuit topology necessary select to estimate the order of the electrical frequency filter needed to fit the filter's frequency response within said upper and lower frequency response templates,
   c. establishing a circuit model for the order of filter selected, said circuit model having circuit components including at least two mutually coupled inductors, at least one capacitor, and resistors representing the loss mechanisms of the circuit components, and wherein the mutual inductance between said mutually coupled inductors is represented by a coupling coefficient, K,
   d. establishing component values for the circuit components of the circuit model and the coupling coefficient, K, of the mutually coupled inductors,
   e. determining whether the response of said circuit model fits within the upper and lower frequency response template for the desired frequency response for the selective electrical frequency filter, and if it does not selecting another order for the electrical frequency filter and repeating steps (c) through (e) until a circuit model with component values and a coupling coefficient, K, for the mutually coupled inductors is achieved that fits the desired frequency response,
   f. determining the geometric characteristics of the lossy planar inductors and planar capacitors for the electrical frequency filter based on the component values of the circuit model established by the foregoing steps, including determining the relative placement of the mutually coupled planar inductors needed to achieve the coupling coefficient, K, and
   g. creating an electrical frequency filter based on lossy planar inductors and planar capacitors having geometric characteristics, including the placement of the mutually coupled inductors, determined in accordance with step (f).

10. The method of claim 9 wherein said lossy planar inductors are spiral inductors.

11. The method of claim 9 wherein the loss quality factor, Q, of each of said selected lossy planar inductors is less than approximately 20.

12. The method of claim 9 further comprising providing
   g. lossy planar inductors and capacitors having geometric characteristics as determined from the circuit model for wherein the electric frequency filter in is created using an integrated circuit fabrication process, and
   h. using such lossy planar inductors and capacitors in an integrated circuit fabrication process, wherein setting the lossy planar inductors overlap and the amount of overlap is set in accordance with the coupling coefficient of the mutually coupled inductors as established in said circuit model.

13. The method of claim 9 wherein the mutually coupled spiral inductors are placed in overlapping relation and wherein the degree of overlap is determined by the coupling coefficient, K, indicated by the circuit model established for the electrical frequency filter.

14. An electrical frequency filter having a selective transfer function, said electrical frequency filter comprising
   at least two lossy planar inductors, wherein the loss quality factor, Q, of each of said lossy planar spiral inductors is less than approximately 20, and wherein neither of said lossy planar inductors is shorted,
   at least one planar capacitor connected to each of said planar inductors,
   the planar inductors being arranged in overlapping relation to provide mutual inductance therebetween, wherein the mutual inductance between the lossy planar inductors, along with the capacitance and inductance values for said planar capacitors and planar inductors, achieves a selective transfer function in a passive circuit topology without loss cancellation circuitry.

15. The electrical frequency filter of claim 14 wherein said lossy planar inductors are spiral inductors.

\* \* \* \* \*